(12) United States Patent
Jiang et al.

(10) Patent No.: US 6,881,606 B2
(45) Date of Patent: Apr. 19, 2005

(54) METHOD FOR FORMING A PROTECTIVE LAYER FOR USE IN PACKAGING A SEMICONDUCTOR DIE

(75) Inventors: Tongbi Jiang, Boise, ID (US); Zhiping Yin, Boise, ID (US); Mike Connell, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/391,080

(22) Filed: Mar. 18, 2003

(65) Prior Publication Data

US 2004/0183163 A1 Sep. 23, 2004

(51) Int. Cl.⁷ .............................................. H01L 21/50
(52) U.S. Cl. .................. 438/106; 438/680; 257/100; 257/433
(58) Field of Search .................. 438/106, 680

(56) References Cited

U.S. PATENT DOCUMENTS

| 5,026,667 A | 6/1991 | Roberts, Jr. ............ 437/209 |
| 6,124,179 A * | 9/2000 | Adamic, Jr. ............ 438/309 |
| 2003/0104693 A1 * | 6/2003 | Siegel et al. ............ 438/680 |

* cited by examiner

*Primary Examiner*—David Nelms
*Assistant Examiner*—Long Tran
(74) *Attorney, Agent, or Firm*—Williams, Morgan & Amerson

(57) ABSTRACT

The present invention provides a semiconductor device having a protective layer for use in packaging the semiconductor device. The apparatus includes a dielectric layer, a first passivation layer formed above the dielectric layer, and a protective layer formed above the first passivation layer, the protective layer adapted to reduce stress defect failures in the semiconductor device when packaged.

28 Claims, 2 Drawing Sheets

METHOD FOR FORMING A PROTECTIVE LAYER FOR USE IN PACKAGING A SEMICONDUCTOR DIE

BACKGROUND OF THE INVENTION

1. Field of the Invention

This invention relates generally to semiconductor device, and, more particularly, to a protective layer for use in packaging a semiconductor device.

2. Description of the Related Art

A conventional integrated circuit device, such as a microprocessor, is typically comprised of many thousands of semiconductor devices, e.g., transistors, formed above the surface of a semiconductor substrate. For the integrated circuit device to function, the transistors must be electrically connected to one another through conductive interconnect structures. Many modem integrated circuit devices are very densely packed, i.e., there is very little space between the transistors formed above the substrate. Thus, these conductive interconnect structures must be made in multiple layers to conserve plot space on the semiconductor substrate.

Commonly, dielectric layers, such as silicon oxide or silicon nitride, are formed between various layers during the manufacture of the semiconductor device. In cases where copper is used to form the conductive interconnect structures in the semiconductor device, the dielectric layer may act as a protective layer to prevent diffusion of the copper and as an antireflective coating for subsequent photolithography steps. Passivation layers, also formed of silicon nitride, for example, may be formed above the topmost layer of the semiconductor device. Typically, such a passivation layer acts as a barrier to contaminants that may cause the underlying semiconductor device to operate in an undesirable manner or to fail.

FIG. 1A shows an exemplary prior art semiconductor device 100. The semiconductor device 100 includes at least one, and typically several, device layer(s) 105, which may contain transistors, interconnect structures, and the like, as discussed above. One or more metal structures 110 may be formed above the device layer 105. For example, the metal structures 110 may be electrical contacts and/or interconnects used to provide conductive connections to the integrated circuits in the device layer(s) 105. The metal structures 110 may also be pads, gates, or the like. The device layer(s) 105 may be formed above a semiconductor substrate (not shown) or above another device layer (not shown).

One or more passivation layers 120, 125, 130 may be formed above the metal structures 110 and the device layer 105. In the illustrated embodiment, the passivation layers 120, 125, 130 are a tetraethyl orthosilicate (TEOS) layer 120, a nitride passivation layer 125, and a polyimide layer 130. However, it will be appreciated that, in alternative embodiments, fewer passivation layers 120, 125, 130 may be formed above the metal structures 110. For example, the polyimide layer 130 may not be included. The passivation layers 120, 125, 130 may be formed by a variety of processes known to those of ordinary skill in the art, including chemical vapor deposition, plasma-enhanced chemical vapor deposition, spin-on processes, thermal growth, and the like.

After the semiconductor device 100 has been formed, typically in a wafer containing many such semiconductor devices 100, it may be installed in a package suitable for use in combination with other components, in forming a system, for example. During the packaging process, the passivation layers 120, 125, 130 may be damaged and the reliability of the semiconductor device 100 may be compromised. FIG. 1B shows an exemplary packaged semiconductor device 100. To package the semiconductor device 100, a package substrate 150 may be deployed above the passivation layers 120, 125, 130, in a manner well known to those of ordinary skill in the art. A mold compound 140, such as an epoxy-based compound, may then be injected into the package body in the space between the package substrate 150 and the passivation layers 120, 125, 130. Those of ordinary skill in the art will be well versed in injection processes used for this purpose.

During the packaging process, filler particles 160 in the mold compound 140 can become trapped between the semiconductor device 100 and the substrate 150. For example, the filler particles 160 may be $SiO_2$. As the mold compound 140 is forced into the space between the substrate 150 and the semiconductor device 100, the filler particles 160 may be pushed into the passivation layers 120, 125, 130. For example, a force, indicated by the arrow 155, may be applied to position the substrate 150 above the mold compound 140. In response to the force 155 applied to the substrate 150, the filler particles 160 may exert a force, indicated by the arrow 170, on the passivation layers 120, 125, 130.

The force 170 may result in stress fractures in one or more of the passivation layers 120, 125, 130, causing one or more of the passivation layers 120, 125, 130 to function in an undesirable manner or to fail. For example, the filler particles 160 may cause stress defect failures 175 in the nitride layer 125 and/or the TEOS layer 120, thus adversely affecting the metal structures 110 and/or the device layer 105. The stress defect failures 175 may also create points of failure in the metal structures 110 and/or the various structures that may be formed in the device layer 105 and, consequently, the stress defect failures 175 may cause the semiconductor device 100 to operate in an undesirable manner or to fail altogether.

The present invention is intended to overcome, or at least reduce the effects of, one or more of the above problems.

SUMMARY OF THE INVENTION

In one aspect of the instant invention, a semiconductor device is provided having a protective layer for use in packaging the semiconductor device. The apparatus includes a dielectric layer, a first passivation layer formed above the dielectric layer, and a protective layer formed above the first passivation layer, the protective layer adapted to reduce stress defect failures in the semiconductor device when packaged.

In a further aspect of the present invention, a method is provided for forming a semiconductor device. The method includes forming a dielectric layer, forming a first passivation layer above the dielectric layer, and forming a protective layer above the first passivation layer, the protective layer adapted to reduce stress defect failures in the semiconductor device when packaged.

BRIEF DESCRIPTION OF THE DRAWINGS

The invention may be understood by reference to the following description taken in conjunction with the accompanying drawings, in which like reference numerals identify like elements, and in which.

Figure 1A:
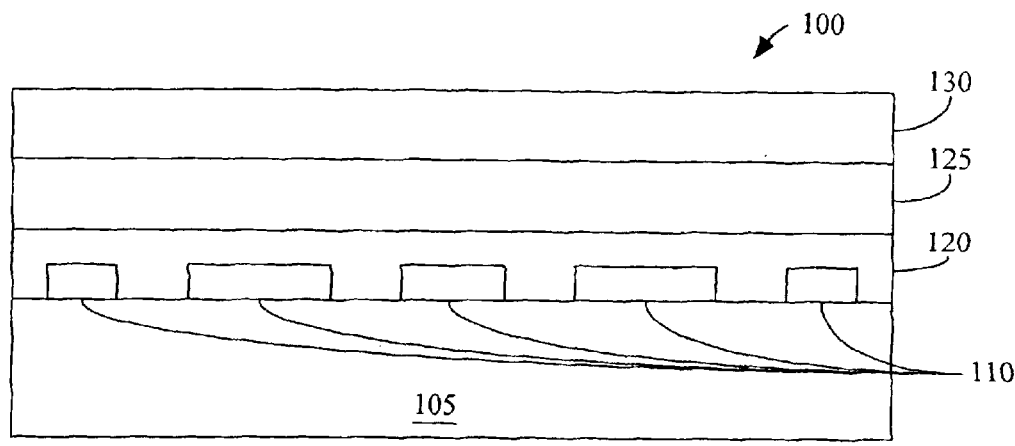
FIG. 1A shows an exemplary prior art semiconductor device.
Figure 1B:
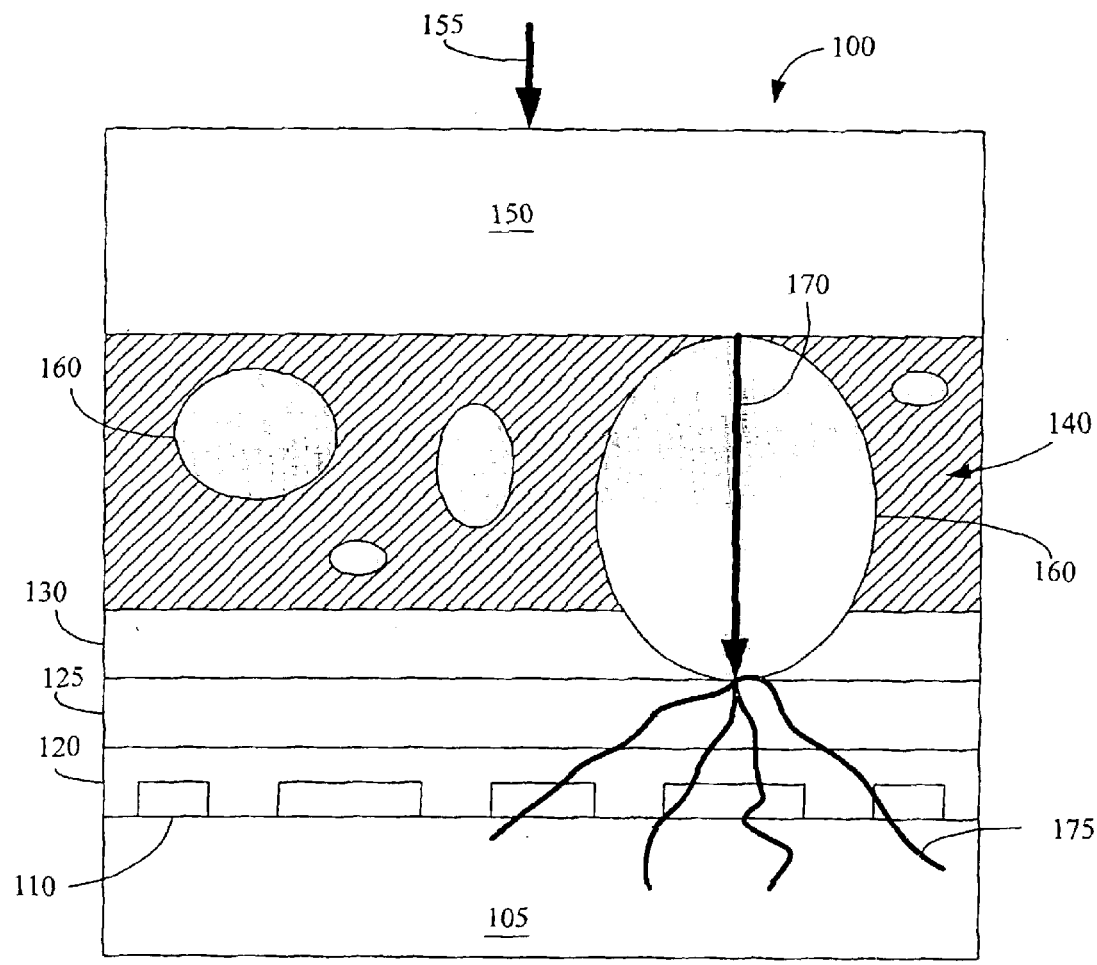
FIG. 1B shows an exemplary prior art packaged semiconductor device.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all details of an actual implementation are described in this specification. It will of course be appreciated that in the development of any such actual embodiment, numerous implementation-specific decisions must be made to achieve the developers' specific goals, such as compliance with system-related and business-related constraints, which may vary from one implementation to another. Moreover, it will be appreciated that such a development effort might be complex and time-consuming, but would nevertheless be a routine undertaking for those of ordinary skill in the art having the benefit of this disclosure.

Figure 2:
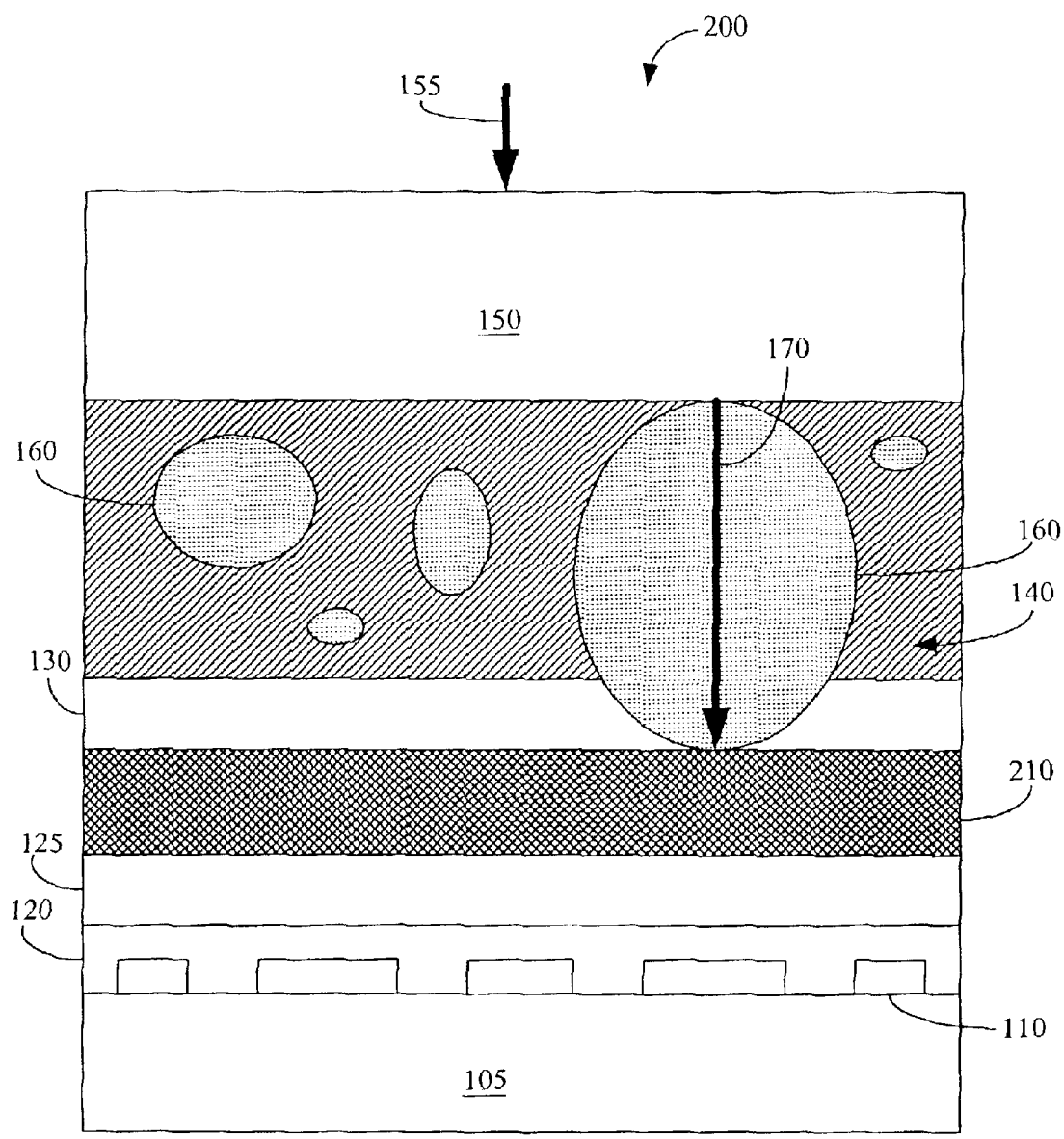
FIG. 2 shows an exemplary packaged semiconductor device that includes a protective layer, in accordance with one embodiment of the present invention.

FIG. 2 shows an exemplary packaged semiconductor device 200. Only those features useful for understanding of the present invention are shown and discussed. Although the various regions and structures of the semiconductor device 200 are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the sizes of those features on fabricated devices. Nevertheless, the attached drawings are included to describe and explain illustrative examples of the present invention.

As discussed previously, the semiconductor device 200 may include the device layer 105. In one embodiment, the device layer 105 is a dielectric layer, or a collection of dielectric layers containing a variety of components that may include transistors, interconnect structures, and the like. The various components of the device layer 105 may be formed above a silicon substrate and/or another device layer (not shown). In the illustrated embodiment, one or more metal structures 110 may also be formed above the device layer 105. The TEOS layer 120 may be formed above the metal structures 110 and/or the device layer 105 by a variety of processes well-known to those of ordinary skill in the art. The process by which the TEOS layer 120 is formed, as well as the parameters and dimensions of the TEOS layer 120, are not material to the present invention and so will not be described in detail herein.

The semiconductor device 200 includes a first passivation layer 125. In the illustrated embodiment, the first passivation layer 125 is a nitride passivation layer 125 formed above the TEOS layer 120. For example, the nitride passivation layer 125 may be formed of silicon nitride and have a thickness of about 6000 Å. However, it will be appreciated by those of ordinary skill in the art having benefit of the present disclosure that the first passivation layer 125 may be formed of other materials and may be thicker or thinner than about 6000 Å.

In various alternative embodiments, the first passivation layer 125 may be formed by a variety of processes well-known to those of ordinary skill in the art. For example, the first passivation layer 125 may be formed using chemical vapor deposition (CVD), low-pressure CVD (LPCVD), plasma-enhanced chemical vapor deposition (PECVD), sputtering and physical vapor deposition (PVD), and the like. The first passivation layer 125 may also be formed using well known spin-on process. Typically, the first passivation layer 125 is formed using a relatively low-temperature process because of the potentially adverse effects on various portions of the semiconductor device 200 of high temperatures at that stage of the fabrication process. However, the present invention is not limited to the use of low temperature processes to form the first passivation layer 125.

The semiconductor device 200 includes a protective layer 210, in accordance with one embodiment of the present invention. For example, the protective layer 210 may be formed of silicon carbide and may have a thickness ranging from 1000–3000 Å, however, the present invention is not so limited. In alternative embodiments, the protective layer 210 may be formed from or include other materials. For example, impurities such as nitrogen may be introduced into the protective layer 210 to alter physical properties such as the toughness, hardness, adhesion, etchability, and the like. Furthermore, the thickness of the protective layer 210 may be outside of the range 1000–3000 Å.

In the illustrated embodiment, the protective layer 210 is formed above the first passivation layer 125. The protective layer 210 may be deposited above the first passivation layer 125 by, for example, a plasma-enhanced chemical vapor deposition (PECVD) process. However, in alternative embodiments, it will be appreciated by those of ordinary skill in the art that other processes, including chemical vapor deposition (CVD), low-pressure CVD (LPCVD), physical vapor deposition (PVD), sputtering, spin-on, and the like, may be used to form the protective layer 210.

A second passivation layer 130 may be formed above the protective layer 210. For example, the second passivation layer 130 may be a polymer layer 130 having a thickness ranging from 5000 Å to 500,000 Å. In various alternative embodiments, the polymer layer 130 may be formed of a polyimide material, a Cardo material, an epoxy material, a benzocyclobutene material, a polybenzoxazole material, a silicon material, and the like. The second passivation layer 130 may be formed by a variety of processes well-known to those of ordinary skill in the art. However, it will be appreciated by those of ordinary skill in the art having benefit of the present disclosure that the second passivation layer 130 is not required for the practice of the present invention and may be omitted if so desired.

During packaging, the filler particles 160 can become trapped between the protective layer 210 and the substrate 150, and the filler particles 160 may transmit the force 170 to the semiconductor device 200 in response to the force 155, as discussed previously. However, the protective layer 210 above the first passivation layer 125 will make the semiconductor device 200 more able to withstand the force 170 and resist, or prevent, stress defect failures 175. In particular, forming a SiC protective layer 210 above the nitride passivation layer 125 has been demonstrated to reduce the number of stress defect failures 175.

Consequently, forming the protective layer 210 above the first passivation layer 125 may also reduce the number of failures of the semiconductor device 200 and thereby increase yield and throughput in the semiconductor fabrication process. Furthermore, forming the SiC protective layer 210 may also improve refresh times in the semiconductor device 200.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor device, comprising:
   forming a dielectric layer;
   forming a first passivation layer above the dielectric layer; and
   forming a protective layer above the first passivation layer, the protective layer adapted to reduce stress defect failures in the semiconductor device when packaged.

2. The method of claim 1, wherein forming the first passivation layer comprises forming a silicon nitride passivation layer.

3. The method of claim 2, wherein forming the silicon nitride passivation layer comprises forming the silicon nitride passivation layer using at least one of a chemical vapor deposition (CVD) process, a low-pressure CVD (LPCVD) process, a plasma-enhanced chemical vapor deposition (PECVD) process, a physical vapor deposition (PVD) process, and a sputtering process.

4. The method of claim 2, wherein forming the silicon carbide protective layer comprises forming the silicon carbide protective layer using at least one of a chemical vapor deposition (CVD) process, a low-pressure CVD (LPCVD) process, a plasma-enhanced chemical vapor deposition (PECVD) process, and a physical vapor deposition (PVD) process, and a sputtering process.

5. The method of claim 1, wherein forming the protective layer comprises forming a silicon carbide protective layer.

6. The method of claim 1, wherein forming the protective layer comprises forming the protective layer having a thickness of about 1000–3000 Å.

7. The method of claim 1, wherein forming the first passivation layer comprises forming the first passivation layer by a spin-on process.

8. The method of claim 1, wherein forming the protective layer comprises forming the protective layer by a spin-on process.

9. The method of claim 1, further comprising:
   deploying a substrate above the protective layer; and
   depositing a mold compound between the substrate and the protective layer, wherein the mold compound includes at least one filler particle.

10. The method of claim 9, wherein depositing the mold compound comprises depositing an epoxy-based compound.

11. The method of claim 1, further comprising forming a second passivation layer above the protective layer.

12. The method of claim 11, wherein forming the second passivation layer comprises forming the second passivation layer having a thickness ranging from about 5000 Å to about 500,000 Å.

13. The method of claim 11, wherein forming the second passivation layer comprises forming a polymer layer.

14. The method of claim 13, wherein forming the polymer layer comprises forming the polymer layer from at least one of a polyimide material, a Cardo material, an epoxy material, a benzocyclobutene material, a polybenzoxazole material, and a silicon material.

15. The method of claim 1, wherein packaging the semiconductor device comprises:
   deploying a substrate above the protective layer; and
   depositing a mold compound between the substrate and the protective layer, wherein the mold compound includes at least one filler particle.

16. The method of claim 15, wherein depositing the mold compound comprises depositing an epoxy-based compound.

17. A method of forming a semiconductor device, comprising:
   forming a dielectric layer;
   forming a first passivation layer above the dielectric layer;
   forming a protective layer above the first passivation layer, the protective layer adapted to reduce stress defect failures in the semiconductor device when packaged; and
   packaging the semiconductor device.

18. The method of claim 17, wherein forming the first passivation layer comprises forming a silicon nitride passivation layer.

19. The method of claim 18, wherein forming the silicon nitride passivation layer comprises forming the silicon nitride passivation layer using at least one of a chemical vapor deposition (CVD) process, a low-pressure CVD (LPCVD) process, a plasma-enhanced chemical vapor deposition (PECVD) process, a physical vapor deposition (PVD) process, and a sputtering process.

20. The method of claim 17, wherein forming the protective layer comprises forming a silicon carbide protective layer.

21. The method of claim 20, wherein forming the silicon carbide protective layer comprises forming the silicon carbide protective layer using at least one of a chemical vapor deposition (CVD) process, a low-pressure CVD (LPCVD) process, a plasma-enhanced chemical vapor deposition (PECVD) process, and a physical vapor deposition (PVD) process, and a sputtering process.

22. The method of claim 17, wherein forming the protective layer comprises forming the protective layer having a thickness of about 1000–3000 Å.

23. The method of claim 17, wherein forming the first passivation layer comprises forming the first passivation layer by a spin-on process.

24. The method of claim 17, wherein forming the protective layer comprises forming the protective layer by a spin-on process.

25. The method of claim 17, further comprising forming a second passivation layer above the protective layer.

26. The method of claim 25, wherein forming the second passivation layer comprises forming the second passivation layer having a thickness ranging from about 5000 Å to about 500,000 Å.

27. The method of claim 25, wherein forming the second passivation layer comprises forming a polymer layer.

28. The method of claim 27, wherein forming the polymer layer comprises forming the polymer layer from at least one of a polyimide material, a Cardo material, an epoxy material, a benzocyclobutene material, a polybenzoxazole material, and a silicon material.

* * * * *